(12) United States Patent
Kishihara et al.

(10) Patent No.: US 10,468,365 B2
(45) Date of Patent: Nov. 5, 2019

(54) SEMICONDUCTOR DEVICE AND SEMICONDUCTOR DETECTOR, METHODS FOR MANUFACTURING SAME, AND SEMICONDUCTOR CHIP OR SUBSTRATE

(71) Applicants: Shimadzu Corporation, Kyoto (JP); TOHOKU-MICROTEC CO., LTD., Sendai (JP)

(72) Inventors: Hiroyuki Kishihara, Soraku (JP); Toshinori Yoshimuta, Takatsuki (JP); Satoshi Tokuda, Kusatsu (JP); Yukihisa Wada, Soraku (JP); Makoto Motoyoshi, Sendai (JP)

(73) Assignees: SHIMADZU CORPORATION, Nishinokyo-Kuwabaracho, Nakagyo-ku, Kyoto-shi, Kyoto (JP); TOHOKU-MICROTEC CO., LTD., Aza-Aoba, Aramaki, Aoba-ku, Sendai-shi, Miyagi (JP)

( * ) Notice: Subject to any disclaimer, the term of this patent is extended or adjusted under 35 U.S.C. 154(b) by 0 days.

(21) Appl. No.: 15/775,538

(22) PCT Filed: Nov. 12, 2015

(86) PCT No.: PCT/JP2015/081891
§ 371 (c)(1),
(2) Date: May 11, 2018

(87) PCT Pub. No.: WO2017/081798
PCT Pub. Date: May 18, 2017

(65) Prior Publication Data
US 2018/0331060 A1 Nov. 15, 2018

(51) Int. Cl.
*H01L 23/00* (2006.01)
*H01L 27/146* (2006.01)

(52) U.S. Cl.
CPC .............. *H01L 24/13* (2013.01); *H01L 24/11* (2013.01); *H01L 24/16* (2013.01);
(Continued)

(58) Field of Classification Search
CPC ... H01L 2224/11001; H01L 2224/1145; H01L 2224/13011; H01L 2224/13014;
(Continued)

(56) References Cited

U.S. PATENT DOCUMENTS

2013/0270694 A1* 10/2013 Hwang .................... H05K 1/11
257/737
2016/0322321 A1* 11/2016 Yajima .................... H01L 24/13

FOREIGN PATENT DOCUMENTS

JP  H02-271634 A  11/1990
JP  H11-260848 A  9/1999
(Continued)

OTHER PUBLICATIONS

International Search Report dated Jan. 26, 2016 of International Application No. PCT/JP2015/081891.

*Primary Examiner* — Yosef Gebreyesus
(74) *Attorney, Agent, or Firm* — Muir Patent Law, PLLC

(57) ABSTRACT

In a method for manufacturing a radiation detector, counter pixel electrodes 33 are formed on a counter substrate 2 at positions facing a plurality of pixel electrodes formed on a signal reading substrate, and wall bump electrodes 34 are further formed on the counter pixel electrodes 33. In order to achieve the above, a resist R is applied, and the resist R is exposed to light to form openings O. When Au sputter deposition is performed on the openings O, only some of the Au is deposited on the bottom surface in the openings O as the counter pixel electrodes 33. The rest of the Au is not deposited on the bottom surface in the openings O, and the most of the remaining Au adheres to the inner walls of the
(Continued)

openings O to form wall bump electrodes 34. The bump electrodes 34 are cylindrical, making it possible to reduce the pressure acting on the signal reading substrate by an extent corresponding to the decrease in the bonding area in comparison to conventional bump-shaped bump electrodes. The decrease in the bonding area also makes it possible to correspondingly improve the reproducibility of forming the diameter of the electrodes, and make reliable connection possible.

6 Claims, 5 Drawing Sheets

(52) U.S. Cl.
CPC .. *H01L 27/14632* (2013.01); *H01L 27/14636* (2013.01); *H01L 2224/11001* (2013.01); *H01L 2224/1145* (2013.01); *H01L 2224/13011* (2013.01); *H01L 2224/13014* (2013.01); *H01L 2224/13019* (2013.01); *H01L 2224/13144* (2013.01); *H01L 2224/1607* (2013.01); *H01L 2224/16059* (2013.01); *H01L 2224/16148* (2013.01); *H01L 2224/16225* (2013.01); *H01L 2224/32225* (2013.01); *H01L 2224/73204* (2013.01)

(58) Field of Classification Search
CPC . H01L 2224/13019; H01L 2224/16059; H01L 2224/1607; H01L 2224/16148; H01L 2224/32225; H01L 2224/73204; H01L 27/14632; H01L 27/14636; H01L 24/13; H01L 24/11; H01L 24/16
See application file for complete search history.

(56) References Cited

FOREIGN PATENT DOCUMENTS

| | | |
|---|---|---|
| JP | 2003-298012 A | 10/2003 |
| JP | 2005-019429 A | 1/2005 |
| JP | 2008-130992 A | 6/2008 |
| JP | 2015-165185 A | 9/2015 |
| WO | 2014/006812 A1 | 1/2014 |

* cited by examiner

SEMICONDUCTOR DEVICE AND SEMICONDUCTOR DETECTOR, METHODS FOR MANUFACTURING SAME, AND SEMICONDUCTOR CHIP OR SUBSTRATE

TECHNICAL FIELD

The present invention relates to a semiconductor device, a semiconductor detector, a method of manufacturing thereof, a semiconductor chip or a substrate used in a medical field, an industrial field, a nuclear field and the like.

BACKGROUND ART

The so-called "flip-chip bonding" in which an electrode of a semiconductor chip and an electrode on the signal reading substrate are faced to each other and electrically connected via a conductive bump (bump electrode) has a structure as shown in FIG. 7. This structure includes a signal reading substrate 101, a semiconductor chip 102, pixel electrodes 103, conductive bumps 104, and an insulating layer 105.

The signal reading substrate 101 is a signal reading substrate, such as, e.g., a CMOS integrated circuit, in which the pixel electrodes 103 are arranged in a two-dimensional matrix, for example. Note that in place of the semiconductor chip, a substrate typified by a counter substrate or the like may be used. The pixel electrodes 103 are formed on the signal reading substrate 101. The conductive bumps 104 are formed on the semiconductor chip 102 as counter pixel electrodes at positions facing the pixel electrodes 103.

The flip-chip bonding shown in FIG. 7 is used for a light detector or a radiation detector to detect light or radiation and extract a signal obtained by detection. As the flip-chip bonding, in addition to metal bonding using a solder bump, a gold bump, etc., adhesive bonding such as conductive resin bonding which is bonding using an organic material or anisotropic conductive member bonding can be exemplified. In addition to the flip-chip bonding, it can also be applied to cases where both substrates are used as bonding targets (see, for example, Patent Document 1).

PRIOR ART

Patent Document

Patent Document 1: International Patent Publication WO 2014/006812

SUMMARY OF THE INVENTION

Problems to be Solved by the Invention

However, conventional flip-chip bonding has the following problems. That is, in cases where the pitch of electrodes (which coincides with the pixel pitch) is 50 µm or more, bonding can be performed without problem, but in cases where the pitch becomes 20 µm or less, the bump size becomes finer, which makes it difficult to form uniform bumps and perform bonding.

The present invention has been made in view of such circumstances, and an object thereof is to provide a semiconductor device, a semiconductor detector, a method of manufacturing the same, a semiconductor chip or a substrate, which can reliably perform bonding.

Means for Solving the Problems

In order to attain such an object, the present invention has the following configuration.

A semiconductor device according to a preferred embodiment of the present invention includes: a first electrode formed on one of a semiconductor chip and a substrate; a second electrode formed on the other of the semiconductor chip and the substrate at a position facing the first electrode; and a cylindrical electrode formed on the second electrode, wherein the first electrode of the one of the semiconductor chip and the substrate and the cylindrical electrode of the other of the semiconductor chip and the substrate are configured to be mechanically and electrically connected to each other.

Since the cylindrical electrode has a cylindrical shape, the pressure to be applied to the semiconductor chip or the substrate can be lowered as the bonding area becomes smaller as compared with a conventional bump shaped bump electrode. Further, as the bonding area becomes smaller, the diameter of the electrode can also be formed with good reproducibility, and the connection can be reliably performed.

In a preferred embodiment, the cylindrical electrode is formed in an inwardly inclined cylindrical shape such that an inner diameter and an outer diameter of a side of the cylindrical electrode to be connected to the first electrode gradually decrease with respect to an inner diameter and an outer diameter of the cylindrical electrode on a side of the second electrode. When the first electrode and the cylindrical electrode are connected, the side of the cylindrical electrode to be connected to the first electrode is somewhat crushed inwardly, so that the contact can be more assuredly made.

In a preferred embodiment, the second electrode and the cylindrical electrode are integrally formed of a same material. In this case, the manufacturing process can be simplified, and there is no peeling problem between the second electrode and the cylindrical electrode, and reliable electrical connection can be maintained.

In a preferred embodiment, a plurality of the second electrodes and a plurality of the cylindrical electrodes are formed in association with a single first electrode.

In a preferred embodiment, when a height of the cylindrical electrode is t and a diameter of the cylindrical electrode is d, a condition of $t/d \geq \frac{1}{2}$ is satisfied.

A semiconductor detector according to a preferred embodiment of the present invention has a configuration of the aforementioned semiconductor device, wherein one of the semiconductor chip and the substrate is configured to detect light or radiation, and a signal obtained by detection is taken out of the other of the semiconductor chip and the substrate.

A method for manufacturing a semiconductor device according to a preferred embodiment of the present invention includes a cylindrical electrode forming step, wherein the cylindrical electrode forming step comprises a step of forming a second electrode at a position facing a first electrode formed on one of a semiconductor chip and a substrate on the other of the semiconductor chip and the substrate and a step of forming a cylindrical electrode on the second electrode.

According to a preferred embodiment, the step of forming the second electrode and the step of forming the cylindrical electrode include: a step of applying resist; a step of forming an opening by exposing light to the resist; a step of performing deposition to the opening so that a portion which becomes the second electrode is deposited on a bottom surface of the opening and a portion which becomes the cylindrical electrode is deposited on an inner wall of the opening; and a step of removing the resist.

According to a preferred embodiment, the opening is curved inward so that a diameter of a side of the opening to be connected to the first electrode gradually decreases with respect to a diameter of a side of the opening on a side of the second electrode.

According to a preferred embodiment, the method further includes: a step of forming the first electrode on one of the semiconductor chip and the substrate; an electrode contact step for bonding electrodes of both the semiconductor chip and the substrate so that the first electrode formed on one of the semiconductor chip and the substrate and the cylindrical electrode formed on the other of the semiconductor chip and the substrate are in contact with each other; and an electrode connecting step of mechanically and electrically connecting both electrodes by applying pressure, heat or ultrasonic energy to at least one of the first electrode and the cylindrical electrode.

According to a preferred embodiment, the deposition is sputter deposition.

Effects of the Invention

According to the semiconductor device, the semiconductor detector, the method of manufacturing the same, the semiconductor chip or the substrate thereof according to the present invention, since the cylindrical electrode has a cylindrical shape, as the bonding area becomes smaller, the diameter of the electrode can also be formed with good reproducibility and bonding can be assuredly performed.

EXAMPLES

Figure 1:
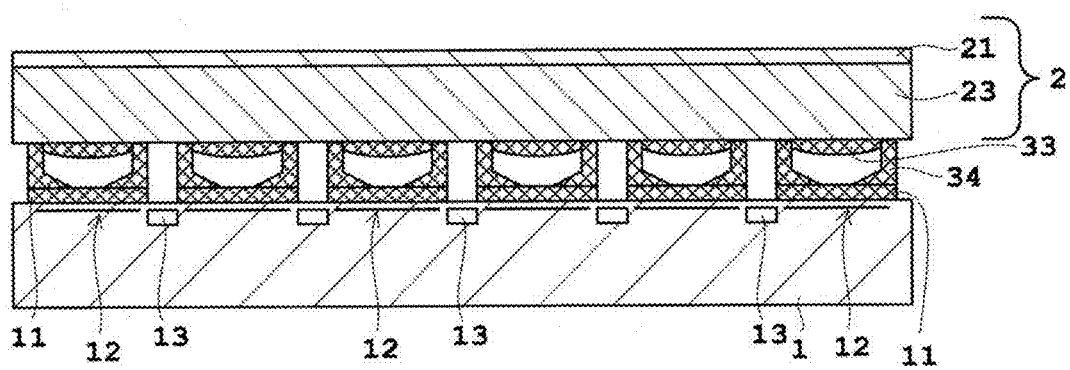
FIG. 1 is a schematic cross-sectional view of a semiconductor detector (radiation detector) according to an Example.
Figure 2:
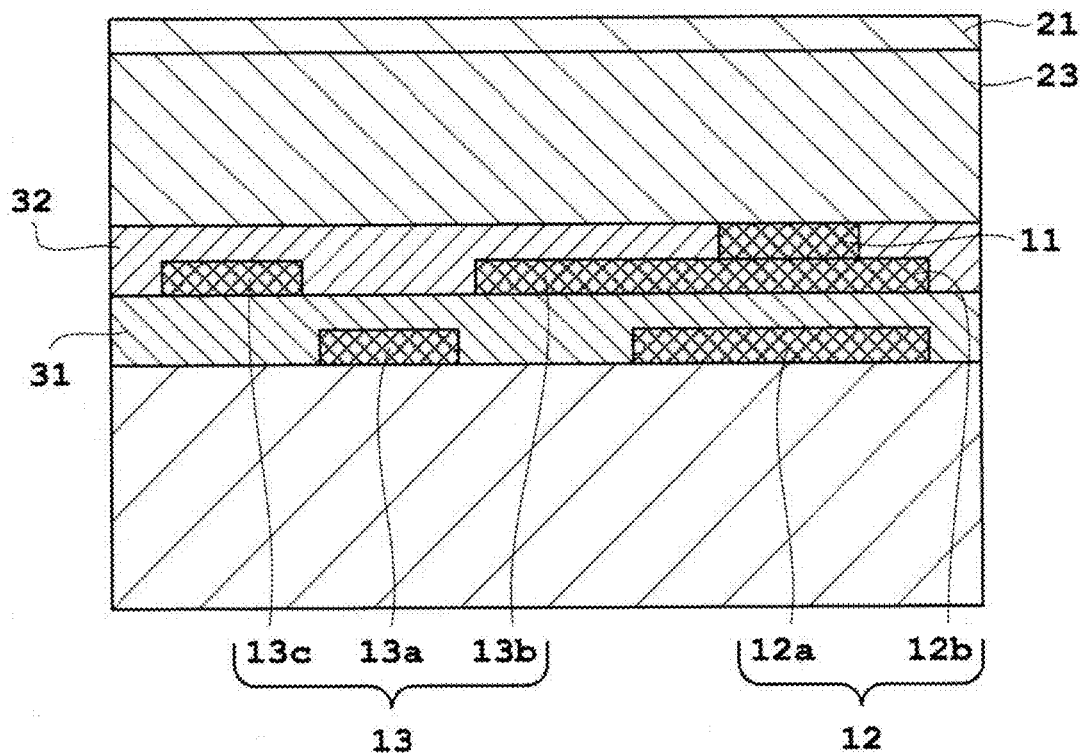
FIG. 2 is a schematic cross-sectional view showing a specific configuration of a signal reading substrate and a counter substrate of the semiconductor detector (radiation detector) according to the Example.
Figure 3:
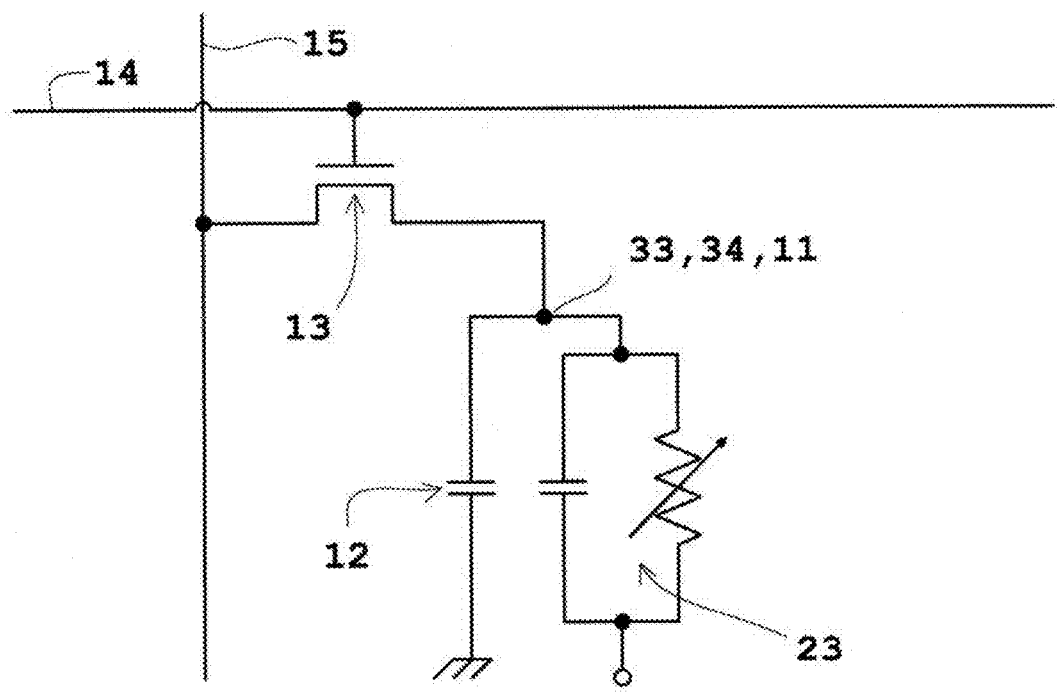
FIG. 3 is an equivalent circuit of the signal reading substrate of the semiconductor detector (radiation detector) per unit pixel according to the Example.

Hereinafter, examples of the present invention will be described with reference to the drawings. FIG. 1 is a schematic cross-sectional view of a semiconductor detector (radiation detector) according to an Example. FIG. 2 is a schematic cross-sectional view showing a specific configuration of a signal reading substrate and a counter substrate of the semiconductor detector (radiation detector) according to the Example. FIG. 3 is an equivalent circuit of a signal reading substrate of the semiconductor detector (radiation detector) per unit pixel according to the Example. In this Example, the semiconductor detector is used as a radiation detector. Note that in FIG. 2, the illustration of the counter pixel electrode and the wall bump electrode is omitted.

As shown in FIG. 1 to FIG. 3, the radiation detector is provided with a signal reading substrate 1 and a counter substrate 2 arranged so as to face the signal reading substrate 1. The signal reading substrate 1 includes pixel electrodes 11 (corresponding to first electrodes) arranged in a two-dimensional matrix and a pixel array layer for arranging the pixel electrodes. On the other hand, the counter substrate 2 is constituted by laminating a common electrode 21 and a photoelectric conversion semiconductor layer 23 in this order. The surface of the counter substrate 2 on the photoelectric conversion semiconductor layer 23 side is electrically connected to pixel electrodes 11 of the signal reading substrate 1 for each pixel. Specifically, by a counter pixel electrode 33 (corresponding to the second electrode) and a wall bump electrode 34 (corresponding to the cylindrical electrode) formed by sputter deposition, which will be described later, the pixel electrode 11 of the signal reading substrate 1 and the photoelectric conversion semiconductor layer 23 of the counter substrate 2 are bonded to each other so as to face each other.

The signal reading substrate 1 is formed of a glass substrate. On the signal reading substrate 1, in addition to the aforementioned pixel electrodes 11, pixel capacitors 12 and switching transistors 13 are formed in a two-dimensional matrix, and scanning lines 14 (see FIG. 3) and signal reading lines 15 (see FIG. 3) are pattern-formed vertically and horizontally in the row and column directions, respectively.

Specifically, as shown in FIG. 2, reference electrodes 12a of the pixel capacitors 12 and gate electrodes 13a of the switching transistors 13 are formed in a laminated manner on the signal reading substrate 1 and covered with an interlayer insulating film 31. On the interlayer insulating film 31, capacitor electrodes 12b of the pixel capacitors 12 are formed in a laminated manner so as to face the reference electrodes 12a with the interlayer insulating film 31 interposed therebetween, and source electrodes 13b and drain electrodes 13c of the switching transistor 13 are formed in a laminated manner, and they are covered with the sealing material 32 except for the part where the pixel electrodes 11 exist. Note that the capacitor electrode 12b and the source electrode 13b are electrically connected to each other. As shown in FIG. 2, the capacitor electrode 12b and the source electrode 13b may be integrally and simultaneously formed. The reference electrode 13a is grounded. As the interlayer insulating film 31, for example, plasma SiN is used.

As shown in FIG. 3, the scanning line 14 is electrically connected to the gate electrode 13a (see FIG. 2) of the switching transistor 13, and the signal reading line 15 is electrically connected to the drain electrode 13c (see FIG. 2) of the switching transistor 13. The scanning line 14 extends in the row direction of pixels, and the signal reading line 15 extends in the column direction of pixels. The scanning line 14 and the signal reading line 15 are orthogonal to each other. The reference numeral 23 in FIG. 3 denotes an equivalent circuit of the photoelectric conversion semiconductor layer. The pixel capacitors 12, the switching transistors 13, and the interlayer insulating film 31 including the scanning lines 14 and the signal reading lines 15 are pattern-formed as a pixel array layer on the surface of the signal reading substrate 1 by using a semiconductor thin film manufacturing technique or a microfabrication technique.

The photoelectric conversion semiconductor layer 23 is formed of CdTe (cadmium telluride), ZnTe (zinc telluride), CdZnTe (cadmium zinc telluride), GaAs (gallium arsenide), and the like.

As described above, the pixel electrode 11 of the signal reading substrate 1 and the photoelectric conversion semiconductor layer 23 of the counter substrate 2 are bonded so as to face each other. By connecting the counter pixel electrode 33 and the wall bump electrode 34 formed by sputter depositing a material containing any one of Au (gold), Cu (copper), Al (aluminum), Ni (nickel), In (indium), Pb (lead), and Zn (zinc) to the pixel electrode 11 of a portion not covered with the interlayer insulating film 31, the pixel electrode 11 of the signal reading substrate 1 and the photoelectric conversion semiconductor layer 23 of the counter substrate 2 are bonded to each other so as to face each other.

The operation of the radiation detector will be explained with reference to FIG. 1 to FIG. 3. When radiation (for example, an X-ray) is incident in a state in which a bias voltage is applied to the common electrode 21, electron-hole pair carriers are generated in the photoelectric conversion semiconductor layer 23 and temporarily stored in the pixel capacitor 12. By driving the scanning line 14 at a necessary timing, the switching transistor 13 connected to the scanning line 14 is shifted to the ON state. As a result, the electron-hole pair carriers accumulated in the pixel capacitor 12 are read out as signal charges, and read out to a subsequent stage signal collecting circuit (not shown) via the signal reading line 15 connected to the switching transistor 13.

Each pixel electrode 11 corresponds to each pixel. Therefore, by converting the signal charge read corresponding to the pixel electrode 11 to a pixel value, a two-dimensional image (radiation image having a two-dimensional distribution) in which pixel values corresponding to the pixel are arranged in two dimensions can be obtained.

Figure 4:
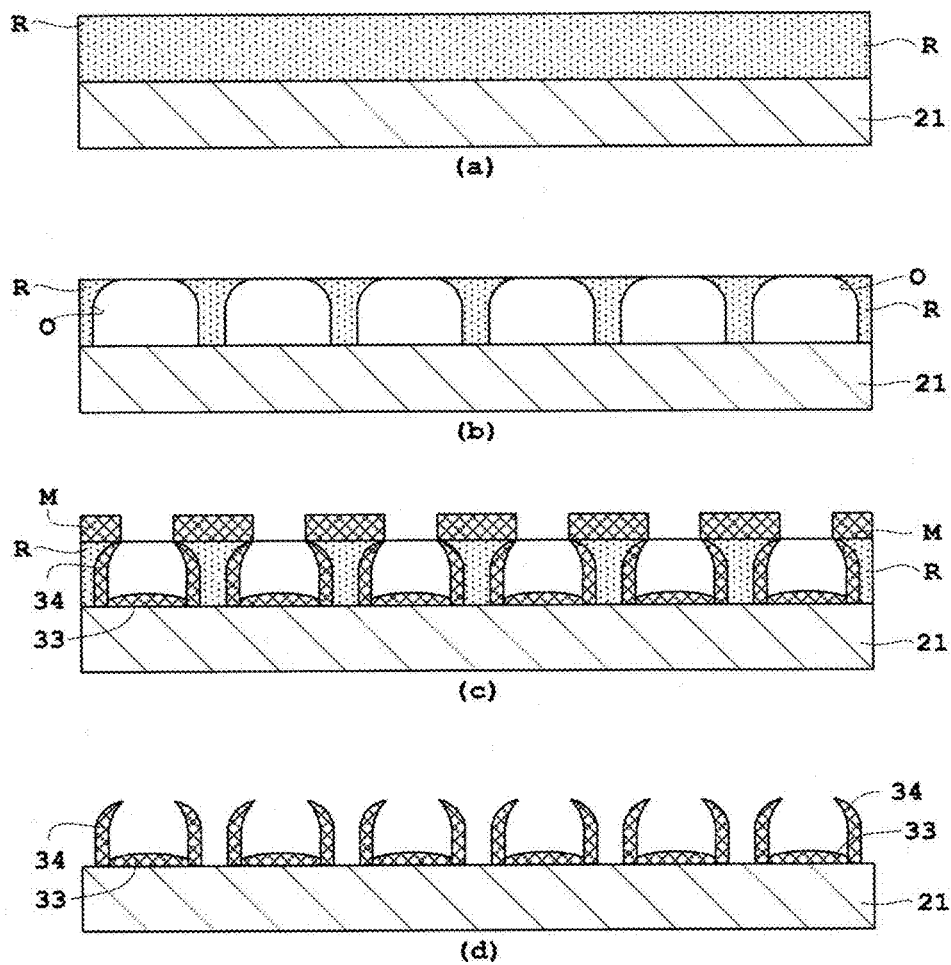
FIG. 4 is a schematic cross-sectional view showing a step of forming a counter pixel electrode and a wall bump electrode according to the Example.

The method of manufacturing the radiation detector will be described with reference to FIG. 4. FIG. 4 is a schematic cross-sectional view showing a process of forming the counter pixel electrodes and the wall bump electrodes according to the Example. Note that in FIG. 4, the illustration of the photoelectric conversion semiconductor layer is omitted.

FIG. 4 shows a process for forming a wall bump electrode of, for example, Au (gold) having a diameter of φ 3 μm and a height of 3 μm. As shown in FIG. 4 (a), a resist R having a thickness of 3 μm is applied to a common electrode 21 (hereinafter collectively referred to as "supporting substrate") on which the photoelectric conversion semiconductor layer 23 (see FIG. 1 and FIG. 2) is formed. Then, as shown in FIG. 4 (b), the resist R is exposed to light to form an opening O having a diameter of φ 3 μm. At this time, a resist in which the upper part of the opening O becomes narrower than the lower part thereof is selected.

Since the Au source for sputtering and the resist R are close to each other, when Au sputter deposition is performed on the opening O shown in FIG. 4 (b), as shown in FIG. 4 (c), only some of Au is deposited on the bottom surface in the opening O as the counter pixel electrode 33, and the remaining is not deposited on the bottom surface in the opening O, so that the most of them adhere to the inner wall of the opening O to form a side wall (side wall). Thus, on the counter pixel electrode 33, the cylindrical electrode formed of the side wall having Au adhered to the inner wall of the opening O is formed. Hereinafter, this cylindrical electrode is called a "wall bump electrode". Note that, except for the opening O, an Au layer M is formed on the resist R as shown in FIG. 4 (c).

According to the shape of the opening O, the shape of the wall bump electrode 34 shown in FIG. 4 (c) is determined. For example, in the case where the shape of the opening O is substantially cylindrical, the wall bump electrode 34 also becomes substantially cylindrical, and in the case where the shape of the opening O is substantially rectangular cylindrical, the wall bump electrode 34 also becomes substantially rectangular cylindrical. The shape of the opening O and the wall bump electrode 34 is not particularly limited. In this Example, the shape of the opening O is curved inward so that the diameter of the side of the opening to be connected to the pixel electrode 11 (the upper side in the figure) gradually decreases with respect to the diameter of the side of the opening on the counter pixel electrode 33 side (lower side in the drawing). That is, the opening O is narrower on the upper side than on the lower side. Therefore, the wall bump electrode 34 is formed into a cylindrical shape curved inward so that the inner diameter and the outer diameter on the side to be connected to the pixel electrode 11 gradually decrease with respect to the inner diameter and the outer diameter on the counter pixel electrode 33 side.

Subsequently, a radiation detector having the structure as shown in FIG. 4 (d) is formed by removing the Au layer M and the resist R shown in FIG. 4 (c). That is, the counter pixel electrode 33 and the wall bump electrode 34 are integrally formed of the same material Au. As shown in FIG. 1, by adhering the pixel electrode 11 of the signal reading substrate 1 and the photoelectric conversion semiconductor layer 23 of the counter substrate 2 so as to face each other, a radiation detector having a structure in which the pixel electrode 11 of the signal reading substrate 1 and the wall bump electrode 34 of the counter substrate 2 are mechanically and electrically connected to each other is formed as shown in FIG. 1.

When bonding both the substrates 1 and 2 so as to face each other, by applying pressure, heat or ultrasonic energy to at least one of the pixel electrode 11 and the wall bump electrode 34, both the electrodes 11 and 34 are bonded together to be mechanically and electrically connected. By bonding both the substrates 1 and 2 so as to face each other, as shown in FIG. 1, the wall bump electrode 34 is somewhat crushed so that the side of the wall bump electrode in contact with the pixel electrode 11 is inwardly bent, resulting in a structure in which the inner wall of the cylinder is bent inward.

In order to form a regular bump in an opening rather than sidewalls, it is required to use a long throw evaporation apparatus (in which the distance between the substrate and the source is long, so the deposition speed is slow) instead of sputter deposition, resulting in a drastically reduced deposition efficiency. This is because in a normal vapor deposition method other than sputter deposition, the source is placed in the center of the substrate, and when the deposition is carried out in a state in which the substrate and the source are arranged close to each other, the directivity is strong, causing a obliquely deposited part at the end or a non-deposited part. Therefore, in order to weaken the directivity and uniformly form a normal bump, it is necessary to adopt a long throw evaporation device. Further, variations in the height of the bump are likely to occur.

On the other hand, by adopting sputter deposition, it is possible to uniformly form the wall bump electrode 34 as shown in FIG. 4 (d). Also, the height of the wall bump electrode 34 is determined almost by the resist thickness.

Figure 5:
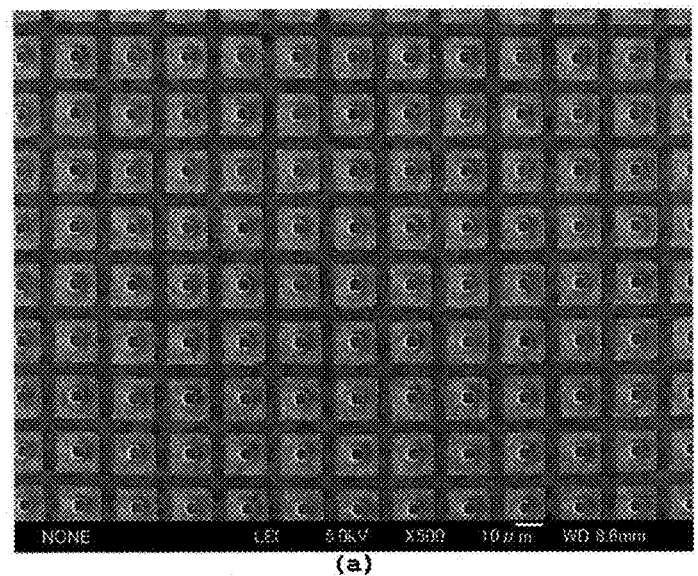
FIG. 5 is a scanning electron microscope (SEM) photograph showing that Au (gold) wall bump electrodes are formed, wherein (a) is a planar SEM with a magnification of 500 times, (b) is a planar SEM with a magnification of 4,000 times, and (c) is a cross-sectional SEM with a magnification of 7,000 times.
Figure 5:
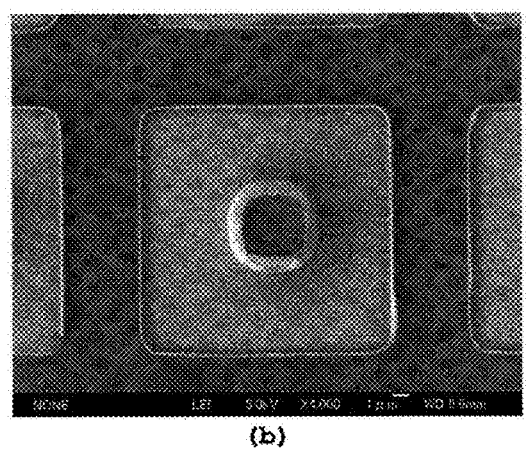
Figure 5:
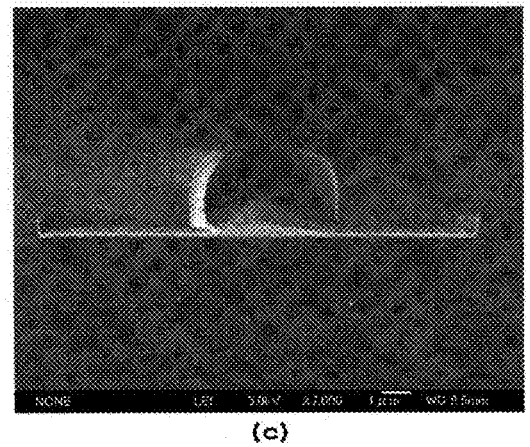

FIG. 5 shows a scanning electron microscope (SEM: Scanning Electron Microscope) photograph showing an Au wall bump electrode with a pitch of 20 µm, an aperture diameter of 3 µm, and height of 3 µm. FIG. 5 (a) is a planar SEM with a magnification of 500 times, FIG. 5 (b) is a planar SEM with a magnification of 4,000 times, and FIG. 5 (c) is a cross-sectional SEM with a magnification of 7,000 times. As shown in FIG. 5, since the wall bump electrode is formed with good reproducibility and the height of the wall bump electrode is determined almost by the resist thickness as described above, in the case of FIG. 5, the height variation is about 0.2 µm.

As the material of the wall bump electrode including the counter pixel electrode, besides Au described in FIG. 5, Cu, Al, Ni and the like as mentioned above can be exemplified. In order to connect a relatively soft semiconductor, such as, e.g., CdTe, as a soft bump material In, Pb, Zn or the like as described above can also be used. Alternatively, a wall bump electrode may be formed of the mixture thereof.

In fact, in order to achieve mechanical and electrical connection, the connection is performed by applying pressure, heat, or ultrasonic energy as described above. Although the bonding area becomes smaller as compared with the case of a normal columnar bump, the overall pressure to be applied at the time of bonding can be reduced accordingly.

When the resist thickness ($\approx$bump height) is "t" and the diameter of the bump (bump diameter) is "d", the aspect ratio "t/d" preferably satisfies the condition of t/d$\geq$½. In the case of t/d<½, the resist thickness ($\approx$bump height) "t" is low or the bump diameter "d" becomes large, making it difficult to maintain the shape of the wall bump electrode. Therefore, in cases where the condition of t/d$\geq$½ is satisfied, it is more preferable that t/d is higher. However, if t/d is too high, the wall bump electrode will not be formed on the counter pixel electrode, or the counter pixel electrode itself will not be formed. Therefore, in cases where the resist thickness ($\approx$bump height) "t" is not too high, for example, the bump diameter "d" is 3 µm, usually, it is more preferable that the resist thickness ($\approx$bump height) "t" is in the range of 3 µm or less and 1.5 µm (=d/2) or more. It should be noted that when the condition of t/d$\geq$½ is satisfied, the specific range of the preferable resist thickness ($\approx$bump height) "t" changes according to the size of the bump diameter d.

According to the radiation detector of this Example having the aforementioned configuration, since the wall bump electrode 34 has a cylindrical shape, the pressure to be applied to a semiconductor chip or a substrate (signal reading substrate 1 in this Example) can be lowered as the bonding area becomes smaller as compared with a conventional bump electrode having a bump shape. Also, as the bonding area becomes smaller, the diameter of the electrode can also be formed with good reproducibility, and the connection can be reliably performed.

When the pixel electrode 11 and the wall bump electrode 34 are connected to each other, the side of the wall bump electrode 34 to be brought into contact with the pixel electrode 11 is somewhat crushed towards the inside, so that the wall bump electrode 34 can be more assuredly brought into contact with the the pixel electrode 11. Further, the counter pixel electrode 33 and the wall bump electrode 34 are integrally formed of the same material. In this case, the manufacturing process can be simplified, and there is no peeling problem between the counter pixel electrode 33 and the wall bump electrode 34, and reliable electrical connection can be maintained.

In addition, the radiation detector according to this Example has the structure of FIG. 1 described above, and it is configured such that one of the semiconductor chip and the substrate (the counter substrate 2 in this Example) detects the radiation and the signal obtained by detection is taken out of the other of the semiconductor chip and the substrate (signal reading substrate 1 in this Example).

The pixel electrode 11, the counter pixel electrode 33, and the wall bump electrode 34 are arranged one-dimensionally or two-dimensionally (two-dimensionally in this Example) so that the pixel pitch becomes less than 50 µm (20 µm in this Example). In this embodiment, one counter pixel electrode 33 and one wall bump electrode 34 are formed in one pixel electrode.

Further, according to the method of manufacturing the radiation detector according to this Example, in the step of FIG. 4 corresponding to the cylindrical electrode forming step, a step of forming the counter pixel electrode 33 at a position facing the plurality of pixel electrodes 11 formed on one of the semiconductor chip and the substrate (signal reading substrate 1 in this Example) on the other of the semiconductor chip and the substrate (counter substrate 2 in this Example) and a step of forming the wall bump electrode 34 on the counter pixel electrode 33 are included.

In the method of manufacturing the radiation detector according to this Example, in the step of forming the first electrode, a plurality of pixel electrodes 11 is formed on one of the semiconductor chip and the substrate (signal reading substrate 1 in this Example). In the electrode contact step, the electrodes (the electrodes 11 and 34 in this Example) of both the semiconductor chip and the substrate (substrates 1 and 2 in this Example) are bonded in an aligned manner so that the pixel electrode 11 formed on one of the semiconductor chip and the substrate (signal reading substrate 1) and the wall bump electrode 34 formed on the other of the semiconductor chip and the substrate (counter substrate 2 in this Example) are brought into contact with each other. Further, in the electrode connection step, by applying pressure, heat or ultrasonic energy to at least one of the pixel electrode 11 and the wall bump electrode 34, both the electrodes 11 and 34 are bonded together to mechanically and electrically connect them.

The present invention is not limited to the aforementioned embodiments, but can be modified and executed as follows.

(1) In the aforementioned Example, the semiconductor detector is used as a radiation detector, but it may be used as a light detector for detecting light. Specifically, either one of the semiconductor chip and the substrate is applied to a light detector having a structure in which light is detected and a signal obtained by detection is taken out of either the other of the semiconductor chip and the substrate.

(2) In the aforementioned Example, although the semiconductor device is used for a radiation detector, it is not necessarily used for a semiconductor detector, such as, e.g., a radiation detector and a light detector. For example, it may be an application other than a semiconductor detector like flip-chip bonding described above.

(3) In the aforementioned Example, the target to which the counter pixel electrode and the cylindrical electrode (wall bump electrode) are formed is a substrate (counter substrate 2 in this Example) and the target to which the pixel electrode is formed is a substrate (signal reading substrate 1 in this Example), but as a bonding target, a semiconductor chip may be used instead of the substrate. For example, like the aforementioned flip-chip bonding, one of the bonding targets may be a substrate and the other of the bonding targets may be a semiconductor chip. Further, both of the semiconductor chips each may be used as a bonding target. In the same manner as in the photoelectric conversion semiconductor layer of the above Example, the semiconductor chip is made of a compound semiconductor, and as the material of the compound semiconductors, CdTe, ZnTe, CdZnTe, and GaAs can be exemplified.

(4) In the aforementioned Example, the semiconductor chip/the substrate forming the counter pixel electrode or the cylindrical electrode (wall bump electrode) detects radiation or light, and the signal obtained by detection is taken out of the semiconductor chip/the substrate, but it may be reversely configured. That is, the semiconductor chip/substrate forming the pixel electrode detects radiation or light and the signal obtained by detection may be taken out of the semiconductor chip/substrate forming the counter pixel electrode or the cylindrical electrode (wall bump electrode).

(5) In the aforementioned Example, the pixel electrode, the counter electrode electrode, and the cylindrical electrode (wall bump electrode) are two-dimensionally arranged so that the pixel pitch is less than 50 μm (20 μm in Example), but it can also be applied to a semiconductor device having a structure in which the pixel electrode, the counter pixel electrode, and the cylindrical electrode (wall bump electrode) are arranged one dimensionally.

Figure 6:
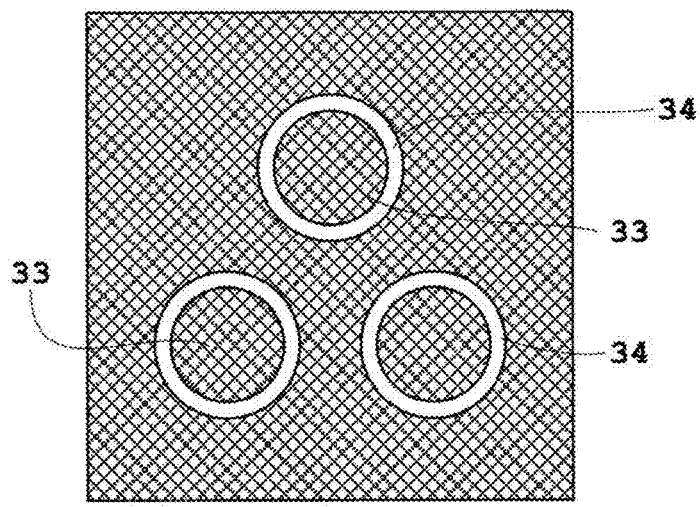
FIG. 6 is a schematic plan view of an example in which three wall bump electrodes are formed in one pixel electrode.
Figure 7:
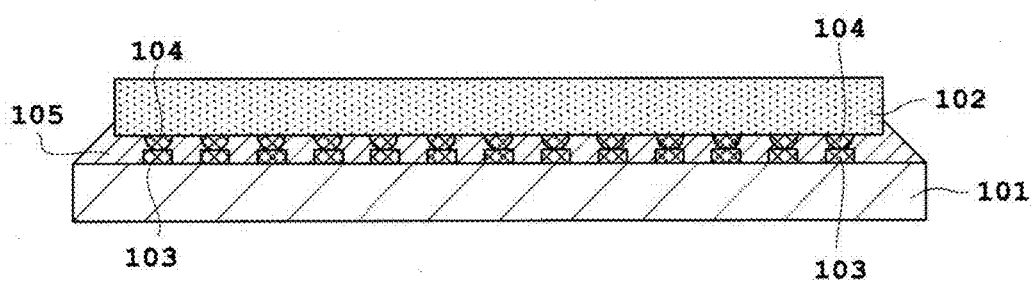
FIG. 7 is a schematic diagram of a flip-chip bonding structure.

(6) In the aforementioned Example, although one counter pixel electrode and one cylindrical electrode (wall bump electrode) are formed within one pixel electrode, in order to increase the bonding area, a plurality of counter pixel electrodes and a plurality of cylindrical electrodes (wall bump electrodes) may be formed. That is, a plurality of second electrodes (counter electrode electrode 33 in Example) and a plurality of cylindrical electrodes (wall bump electrodes) are formed in association with a single first electrode (pixel electrode 11 in Example). An example in which three counter pixel electrodes and three wall bump electrodes are formed in one pixel electrode is shown in a schematic plan view of FIG. 6.

(7) In the aforementioned Example, although counter pixel electrodes and cylindrical electrodes (wall bump electrodes) are formed by sputter deposition, wall bump electrodes may be formed by vapor deposition other than sputter deposition. In cases where the source is arranged in the center of the substrate, when deposition is carried out in a state in which the substrate and the source are arranged close to each other, as described above, there is a possibility that there is a portion obliquely deposited at the end portion or a portion not deposited. Therefore, when the source is arranged over the entire surface of the substrate and deposition is carried out in a state in which the substrate and the source are arranged close to each other, even if deposition other than sputter deposition is carried out in a state in which the directivity is weaken and the film formation rate is fast, it is possible to evenly form the wall bump electrode.

DESCRIPTION OF REFERENCE SYMBOLS

1: signal reading substrate
11: pixel electrode
2: counter substrate
33: counter pixel electrode
34: wall bump electrode

The invention claimed is:

1. A semiconductor device, comprising:
a first electrode formed on a first semiconductor chip or a first substrate;
a second electrode formed on a second semiconductor chip or a second substrate at a position facing the first electrode; and
a cylindrical electrode formed on the second electrode,
wherein the first electrode of the first semiconductor chip or the first substrate and the cylindrical electrode of the second semiconductor chip or the second substrate are configured to be mechanically and electrically connected to each other, and
wherein the cylindrical electrode is formed in an inwardly inclined cylindrical shape such that an inner diameter and an outer diameter of a side of the cylindrical electrode to be connected to the first electrode gradually decrease with respect to an inner diameter and an outer diameter of the cylindrical electrode on a side of the second electrode, so the cylindrical electrode is connected to the first electrode in a shape in which a tip end side to be connected to the first electrode is crushed inwardly over an entire circumference.

2. The semiconductor device as recited in claim 1, wherein the second electrode and the cylindrical electrode are integrally formed of a same material.

3. The semiconductor device as recited in claim 1, wherein a plurality of the second electrodes and a plurality of the cylindrical electrodes are formed in association with a single first electrode.

4. The semiconductor device as recited in claim 1, wherein a condition of $t/d \geq \frac{1}{2}$ is satisfied, where a height of the cylindrical electrode is t and a diameter of the cylindrical electrode is d.

5. A semiconductor detector having a configuration of the semiconductor device as recited in claim 1, wherein one of the first semiconductor chip or the first substrate and the second semiconductor chip or the second substrate is configured to detect light or radiation, and the other of the first semiconductor chip or the first substrate and the second semiconductor chip or the second substrate is configured to take out a signal obtained by detection.

6. A semiconductor chip or a substrate to be connected to another semiconductor chip or substrate on which a first electrode is formed, comprising:
a second electrode formed at a position facing the first electrode; and
a cylindrical electrode further formed on the second electrode,
wherein the cylindrical electrode is formed in an inwardly inclined cylindrical shape such that an inner diameter and an outer diameter of a side of the cylindrical electrode to be connected to the first electrode gradually decrease with respect to an inner diameter and an outer diameter of the cylindrical electrode on a side of the second electrode, so the cylindrical electrode is configured to be mechanically and electrically connected to the first electrode in a shape in which a tip end side to be connected to the first electrode is crushed inwardly over an entire circumference.

* * * * *